United States Patent [19]

Porambo et al.

[11] Patent Number: 5,450,624
[45] Date of Patent: Sep. 12, 1995

[54] METHOD AND APPARATUS FOR DIAGNOSING AMP TO SPEAKER CONNECTIONS

[75] Inventors: Sylvester P. Porambo, Canton; John M. Dicky, Dearborn; John E. Whitecar, Plymouth; John D. Cotner, Ann Arbor, all of Mich.

[73] Assignee: Ford Motor Company, Dearborn, Mich.

[21] Appl. No.: 1,688

[22] Filed: Jan. 7, 1993

[51] Int. Cl.⁶ .......................................... H04B 17/00
[52] U.S. Cl. ........................ 455/226.4; 455/226.1; 381/59
[58] Field of Search .............. 455/226.1, 226.4, 234.1, 455/234.2, 245.1, 250.1; 381/58, 59, 104

[56] References Cited

U.S. PATENT DOCUMENTS

| | | |
|---|---|---|
| 3,602,819 | 8/1971 | Abbott et al. . |
| 3,605,022 | 9/1971 | De Fillipo et al. . |
| 3,755,741 | 8/1973 | Stover . |
| 4,060,767 | 11/1977 | Lohrmann . |
| 4,124,780 | 11/1978 | Ogita ................ 455/226.1 |
| 4,234,964 | 11/1980 | Cieslak et al. . |
| 4,245,352 | 1/1981 | Karpowycz et al. . |
| 4,322,857 | 3/1982 | Grohmann et al. . |
| 4,346,268 | 8/1982 | Geerling ................ 381/58 |
| 4,864,639 | 9/1989 | Dapore et al. . |
| 4,978,926 | 12/1990 | Zerod et al. ........ 455/250.1 |
| 5,042,070 | 8/1991 | Linna et al. ............ 381/59 |
| 5,187,809 | 2/1993 | Rich et al. ......... 455/234.2 |
| 5,276,685 | 1/1994 | Kepler et al. ........ 455/234.1 |

FOREIGN PATENT DOCUMENTS

| | | |
|---|---|---|
| 0027078 | 4/1981 | European Pat. Off. . |
| 3627960 | 9/1987 | Germany . |
| 3709556 | 10/1988 | Germany . |
| 267616A1 | 5/1989 | Germany . |
| 95734 | 6/1982 | Japan ................ 455/226.1 |
| 181233 | 8/1991 | Japan ................ 455/226.4 |
| 2199466 | 7/1986 | United Kingdom . |

*Primary Examiner*—Reinhard J. Eisenzopf
*Assistant Examiner*—Thanh Le
*Attorney, Agent, or Firm*—Roger L. May; Mark L. Mollon

[57] ABSTRACT

A method and apparatus for determining the connection status of a communication system speaker connection to the amplifier includes digital signal processing (DSP) circuitry contained in the system receiving a clip detect feedback loop from the amplifier in response to a tone signal delivered to the amplifier from the DSP microprocessor. Preferably, the diagnosis is initiated by actuation of a predetermined plurality of controllers on a face control unit, each of which is otherwise actuated individually to control portions of the communication system. Preferably, a tone signal generated for diagnosis is generally inaudible to the human ear but the front control unit includes a display screen for illustrating the condition of the speaker-to-amplifier connection after the diagnostic function has been completed.

16 Claims, 3 Drawing Sheets

METHOD AND APPARATUS FOR DIAGNOSING AMP TO SPEAKER CONNECTIONS

TECHNICAL FIELD

The present invention relates generally to a communication apparatus, and more particularly to DSP communication devices having diagnostic capabilities.

BACKGROUND ART

In the production of communication systems such as radios and in the production of vehicles which includes the installation of radios, it is well known to test the communication apparatus before delivery to the customer. In view of the numerous components employed in such systems, and the distribution of such components throughout a vehicle in which it is installed, a point-by-point inspection of all the connections between components in the system is very difficult if not impossible. Moreover, it may be appreciated that visual inspection may not readily identify electrical connection problems which can render the system inoperative or raise the risk of damage to those components improperly connected. Accordingly, diagnostic devices have been developed in order to test the operation of the communication systems.

One previously known form of apparatus for testing communication systems involves a separate apparatus which is adapted to interact with various portions of the system. For example, radio tuners, amplifiers, demodulators and the like may be tested by interacting with the circuitry in the testing apparatus. Likewise, the testing circuitry may emit signals which are transferred to other portions of the system to determine the functioning of certain controls or circuits such as the tone controls, speakers or a graphic equalizer. However, such systems require connection of the testing apparatus with portions of the radio being tested and must be accomplished by disconnecting portions of the system for reconnection to the test apparatus. As a result, the preparation for testing of the radio system with these previously known test apparatus can be laborious, difficult and time consuming to perform.

It has also been known to provide the communication apparatus with self-testing circuitry. However, such circuitry, particularly circuits designed for use in an analysis of analog signals, can be quite complicated, and may substantially increase the size and expense of producing the communication apparatus. Moreover, such apparatus is often limited to testing of discreet signal functions, and does not permit variation of a single signal parameter through a range in which the communication device should operate properly. In particular, such variation may have to be performed manually and thus requires experience and expertise in order to operate the testing equipment properly.

In addition, while parts of the communication system, for example, the radio tuner, may be inspected at the factory for operation before installation in the vehicle, it is necessary to determine that the communication system is functional once it has been installed in the vehicle. Nevertheless, the previously known test apparatus do not permit detection of whether the entire system has been properly installed in a vehicle or other environment. In particular, the installation of a system often requires widely distributed speakers to be connected to the amplifier. In light of recent improvements in audio reproduction systems, where concert hall emulation and other features have been made available by digital signal processing, the operation of each speaker within the system has greater importance than in previously known mono or stereo systems since each speaker has a distinct contribution to the audio output and is not merely a redundant audio source. Accordingly, the connection between each speaker and an amplifier is very important to system operation but is very difficult to monitor within the assembled vehicle.

Technical Problem Resolved

The present invention overcomes the above-mentioned disadvantages by providing a communication system with self-diagnosis circuitry for determining the status of the amplifier-to-speaker connection. In general, the system generates an input to an amplifier, and the output of the amplifier is tested to determine the status of the amplifier output, without requiring the disassembly or reconnection of testing apparatus to the installed communication system. In addition, the system performs a diagnostic routine using the existing control mechanism of the communication system and does not require a substantial amount of additional components to be installed with the communication system.

In the preferred embodiment, a digital signal processor includes a generator for generating an input signal at a predetermined level to the amplifier. Preferably a feedback signal identifies the amplitude level of the generated signal. In addition, a clip detector advises of the occurrence of signal clipping in the amplifier. The clip detector also preferably includes a feedback loop that identifies the clipped output to a digital signal processor control apparatus (DSP).

If clipping occurs at an input signal amplitude below a predetermined level, a short circuit condition is identified by the DSP. Similarly, a detection of a clipping threshold at an input voltage amplitude greater than a predetermined level will indicate an open circuit condition between the amplifier and the speaker. In each situation, an appropriate indicia can be generated for ready recognition by testing personnel, for example, a visual display may be illuminated at the front control unit of the radio system to identify the condition detected. If the clipping occurs within a predetermined range of input voltages delivered to the amplifier, the equipment is in proper operating condition, and the condition of the circuit may also be indicated by appropriate indicia generated as a result of the test.

The diagnostic cycle may be invoked by a certain key press, for example a combination of controls on the front control unit of the DSP radio. Preferably, the DSP generator would generate a generally inaudible tone, that is, a tone in a frequency range to which the human ear is less sensitive e.g. 19 KHz, so that the operator would not be annoyed by the tone during the test procedure. A plurality of speakers may be sequentially tested with the apparatus.

It is an object of the present invention to provide a method and apparatus for diagnosing radio circuit conditions such as the electrical connection between an amplifier and speaker within the system itself without increasing packaging space required for the system. It is a further object to diagnose the amplifier to speaker connection by initiating a diagnostic routine on the radio control unit, generating a signal and applying it to the amplifier, detecting the amplifier response, monitoring the level at which clipping occurs and indicating whether the level at clipping represents an acceptable performance condition in the connection. Furthermore, another object is to automatically vary the input signal level while continuing the above steps to determine a clipping threshold level representative of the connection status.

A further object is to provide a DSP radio system including a diagnostic initiator employing the radio function control unit, a programmed processor for generating a test signal to be applied to an amplifier, detecting the response of the amplifier to the signal and monitoring the level at which the amplifier output is undesirably distorted and indicating the connection status as a response to the relative signal level where clipping occurs. Another object is to provide such a DSP radio system with a comparor in the DSP chip set to compare the level of signal at the clipping threshold with a predetermined normal range of level between a level limit representing a short circuit and a signal level representative of an open circuit between the amplifier and the speaker. A further object is to use the DSP radio system to serially test all speakers in a multiple speaker system.

BRIEF DESCRIPTION OF THE DRAWING

The present invention will be more clearly understood by reference to the following detailed description of a preferred embodiment when read in conjunction with the accompanying drawing in which like reference characters refer to like parts throughout the views and in which.

BEST MODE FOR CARRYING OUT THE INVENTION

Figure 1:
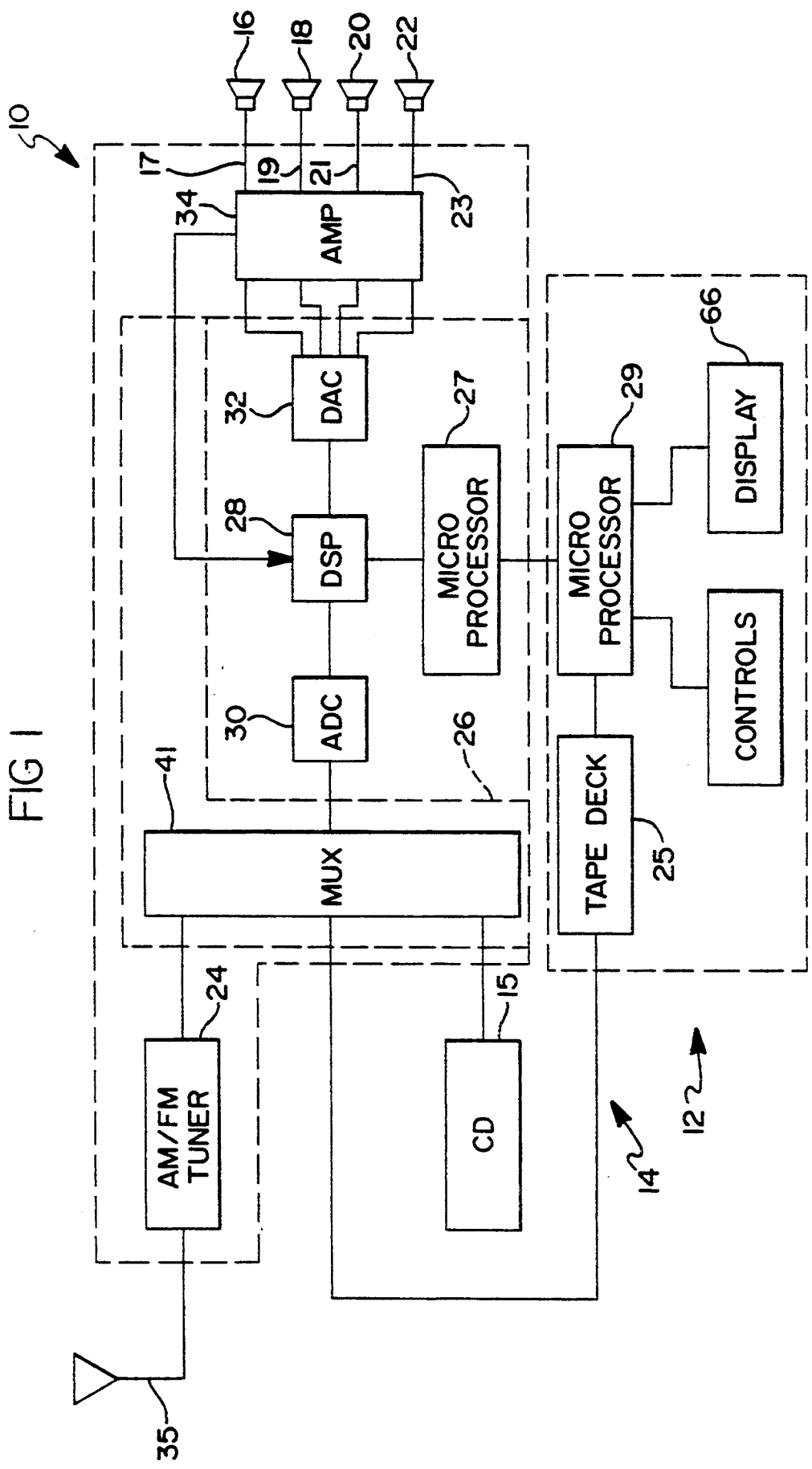
FIG. 1 is a schematic view of the communication system employing the diagnostic apparatus and method according to the present invention.

Referring first to FIG. 1, a communication system 10 is thereshown comprising numerous parts which are generally divided in a manner particularly adapted for installation in a motor vehicle. In particular, a front control unit 12 is adapted for mounting in the instrument panel of the motor vehicle, while a control box 14 including an AM/FM radio tuner unit 24, is mounted in the trunk of a motor vehicle along with selected accessories such as a compact disc player 15. The antenna 35 is mounted externally but coupled to the tuner 24. The number and positions of the accessories may be varied as desired without departing from the invention, although a cassette player 25 is preferably mounted in the front control unit for convenience. The trunk also carries an amplifier 34 coupled by conductors to a left front speaker 16, a left rear speaker 18, a right front speaker 20 and a right rear speaker 22 distributed throughout the passenger compartment of the vehicle in the preferred embodiment for convenience and audio reproduction quality. Nevertheless, the number and positions of speakers may be varied as desired without departing from the scope and spirit of the present invention.

The control box 14 also includes an analog multiplexor 41, for example, two four-input analog switches for selecting signals from the tuner 24, compact disc player 15 or tape deck 25 to an analog to digital (A-D) converter 30. Preferably, the multiplexor 41 provides a differential input to the A-D converter 30 to reduce the effect of changing environmental conditions around the vehicle. The A-D converter 30 is part of a audio signal processing chip set 26 including a digital signal processing (DSP) chip 43, a microprocessing chip 27, a digital audio signal processor (DASP) 31 (see FIG. 3) and a digital to analog (D-A) converter chip 32.

In a preferred embodiment, a two-channel audio 16 bit A-D converter, such as a Philips SAA 7364, can be conveniently coupled to the DSP chip set 28. The chip set 28 includes a combination of chips such as an IC 43, for example, a Texas Instrument TMS 320C25 DSP integrated circuit and an IC chip 31, for example, a Texas Instrument TMS 57002. The D-A convertor comprises a four channel, 18 bit D-A converter 32, such as a Philips TDA 1314. This converter 32 provides two additional bits for an extra 12 db (6 db per bit) dynamic range improvement which enables digital fader control, rather than digitally controlled, analog fader circuitry after the converter 32, to deliver a signal to the amplifier 34 whereby the prominence of each channel 17, 19, 21 and 23 can be adjusted. The DSP chip set 28 is also coupled to a microprocessor chip 27, for example, a Motorola HC11 adapted to provide conventional serial communication, for example, SAE Standard J 1850 communications, with a compatible microprocessor chip 29, for example, another Motorola HC11.

Figure 2:
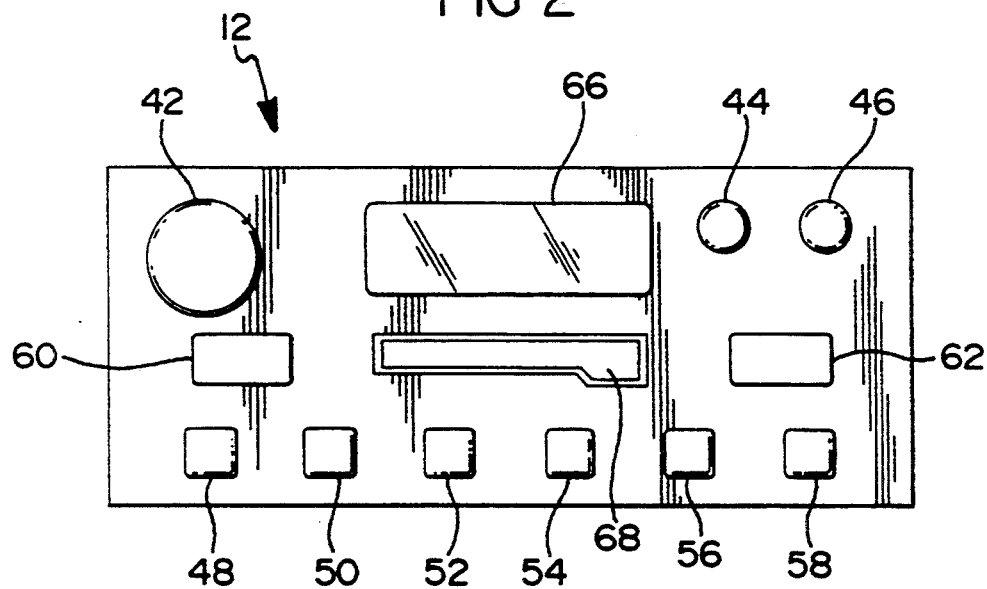
FIG. 2 is an enlarged front elevational view of the front control unit shown in FIG. 1.

As generally indicated in FIG. 1, the front control unit 12 includes controls 42–62 accessible to the vehicle operator, and a display unit 66 for indicating the conditions of the system which have been set by the controls. As more particularly shown in FIG. 2, the front control unit 12 includes a plurality of controls, such as rotary switches 42, 44 and 46, single action push buttons 48, 50, 52, 54, 56 and 58 as well as double-action push buttons 60 and 62. A display screen 66 may be provided by an LCD screen or the like which reflects the condition of the communication devices and the control settings introduced by the operator at the front control unit 12.

While each control selector may ordinarily have a single function, each control can be used in combination with other controls to select functions not normally associated with the use of the communication devices. For example, while the switch 62 might often be used for play and rewind functions for a cassette player receptacle generally designated at 68, a right side activation of the double switch buttons 60 and 62, together with a simultaneous depression of switch 58, may be employed as an initiator for generating a diagnostic program as used in the present invention. In particular, it will be understood that such multiple switch engagement forms an actuator controlling the communication system in a manner substantially different from the individual actuation of the individual controls on the front control unit 12. Regardless of the control combination selected to initiate the diagnosis routine, the control signal is delivered through the microprocessor 27 to the digital signal processing microprocessor 28.

Figure 3:
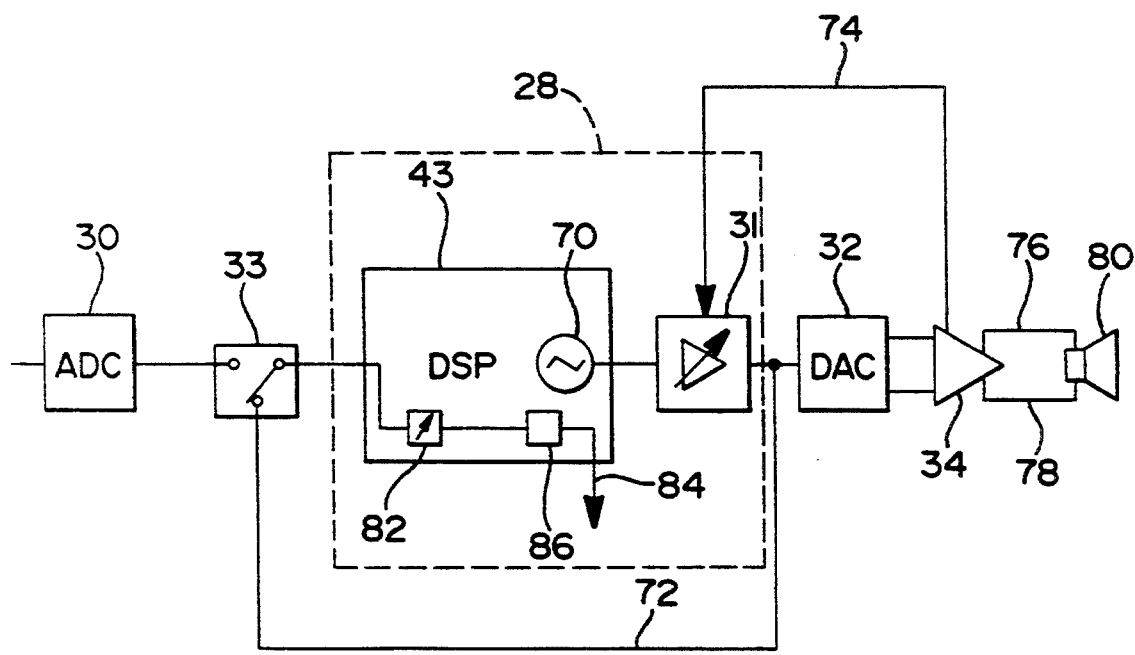
FIG. 3 is a partially more detailed schematic view of a portion of the system shown in FIG. 1.

Referring now to FIG. 3, upon actuation of the diagnostic prompting switch combination, such as the 58, 60 and 62 combination above, the DSP microprocessor 28 is initiated to generate a tone signal at maximum output as indicated diagrammatically at 70.

In the preferred embodiment, a clip detector feedback loop 74 is provided using an audio limiter function such as is provided by the audio power amplifier IC's previously identified. For example, the amplifier 34 of the preferred embodiment includes four SGS Thompson Model L109 integrated circuits, one for each channel shown in FIG. 1. However, in FIG. 3, the multiple channels of the preferred embodiment are generically represented by a single channel comprising conductors 76 and 78 and speaker 80. The clip detector loop 74 provides a clip detection signal, such as a 0 (low) voltage signal generated by the SGS-L109, when the output of the amplifier 34 begins to clip and introduces a significant level of distortion of the output signal. The signal is introduced through an interrupt pin of a signal limiter 31, for example, a Texas Instruments TMS 57002, which continuously reduces the signal level introduced to the D-A converter 32 linearly. Such feedback quickly establishes the limit at which distortion of the amplifier output reaches an acceptable level.

Figure 4:
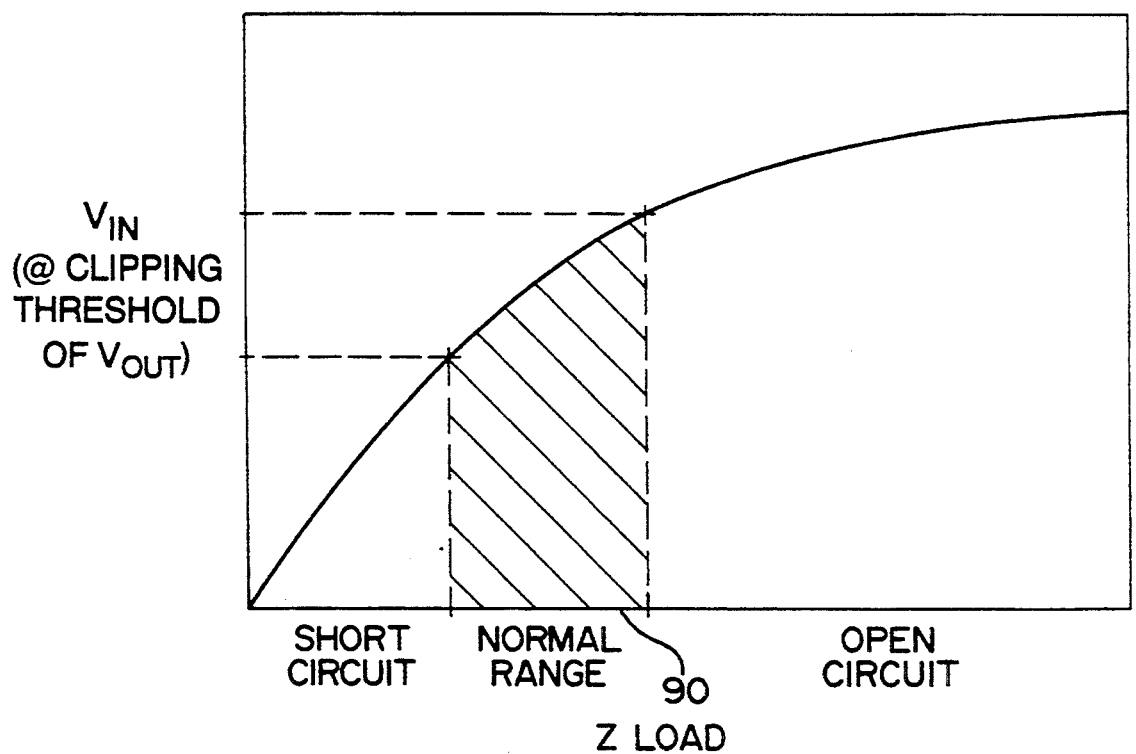
FIG. 4 is a graphic representation of a load impedance to output voltage transfer function demonstrating the performance of a diagnostic apparatus according to the present invention.

An audio level detector loop 72 is input to the DSP 28 by a digital multiplexor switch 33, for example, common logical gating that performs two-to-one multiplexing. If the clipping threshold detected occurs at a level of signal 70 which is within a predetermined range corresponding to an acceptable or normal impedance range 90 as shown in FIG. 4, it will be understood that the conductors 76 and 78 form a complete circuit between the amplifier and the speaker terminals on speaker 80. The acceptable range is dependent upon the variable impedance which may be presented by one or more speakers 80 (for example, the left front 16, left rear 18, right front 20 and right rear 22) connected to the conductors 76 and 78 (for example, each conductor pair of the channels 17, 19, 21, and 23, where a single speaker is coupled to the conductors) in each channel and the total number of channels.

If the microprocessor determines that the level of a signal 70 at the threshold of clipping is below the predetermined, normal range, a shorted connection across the speakers would be detected as indicated to the left of 90 in FIG. 4. Similarly, if the level was higher than the predetermined range 90 when clipping threshold is detected, an open circuit connection would be identified across the conductor pair intended to couple each speaker with the amplifier 34, as illustrated to the right of 90 in FIG. 4. The microprocessor selects each amplifier channel 17, 19, 21, 23 in turn by adjusting the gain to that channel to maximum, while setting the gain of the remaining channels to zero, by changing multiplexer constants in the DSP 28.

As a result of the clipping detection, the DSP 28 would then deliver appropriate signals to the microprocessor 27 in order to transmit control to microprocessor 29 to generate an indicia on the front control unit 12. In particular, the preferred embodiment includes a metering block 82 that communicates to a software comparor 86 that determines whether the threshold of clipping is at a high, normal, or low level as shown in FIG. 4. The microprocessor 27 also reads the updated byte at the eight bit parallel bus 84 to initiate the generation of appropriate indicia at the front control unit 12.

In the preferred embodiment, a symbol such as an LCD sequence illustrating OPEN would be illuminated in the screen 66 to demonstrate an open circuit condition. Similarly, an LCD sequence illustrating SHRT may be indicated at display screen 66 in order to demonstrate a short circuit condition. A PASS symbol may be illuminated at display 66 in order to indicate that the diagnostic test has indicated a normal condition, and thus proper connection between the amplifier 34 and any of the speaker in the speaker set 80. If a plurality of speakers is included in the set, the symbols will be accompanied by LF (left front), RF (right front), LR (left rear) or RR (right rear) symbols in a similar manner.

Thus, the present invention provides a self-contained diagnostic method and apparatus for determining the status of the speaker-to-amplifier conductor connections. The apparatus 10 is provided with substantially no additional hardware features that would occupy instrument panel space. Moreover, the apparatus requires only programming rather than hardware in order to implement initiation of the diagnostic procedure through the front control unit 12 of known DSP radio systems. Only software need be incorporated in the programmable memory of the DSP of a previously known radio assembly in order to implement the control and display of the status of each speaker connection to the DSP radio.

As a result, the present invention provides a simple method and apparatus for testing the installation of a communication system, for example, an entertainment system in a motor vehicle, during production of the vehicle or during installation of the system without requiring special diagnostic equipment or additional hardware in the construction of each communication device.

Having thus described the present invention, many modifications will become apparent to those skilled in the art to which it pertains without departing from the scope and spirit of the present invention as defined in the appended claims.

We claim:

1. A method for diagnosing an electrical connection between a power amplifier output and a speaker in a communication system, comprising:
   initiating a diagnostic routine by selecting a predetermined input on a control unit;
   generating a predetermined tone signal in response to the input selected;
   applying said tone signal to said amplifier;
   detecting a clipping threshold at the output from said amplifier;
   varying a level of said tone signal;
   monitoring the level of tone signal at which said clipping threshold at the output from said amplifier occurs, by comparing the level of tone signal with a predetermined range of levels; and
   indicating whether said clipping threshold at the output from said amplifier commences within said predetermined range of tone signal levels.

2. The method as defined in claim 1 wherein the communication system is a DSP communication device.

3. The method as defined in claim 2 wherein said DSP device is a radio receiver.

4. The method as defined in claim 1 wherein said varying step comprises decreasing the signal level until clipping is terminated.

5. The method as defined in claim 1 wherein said indicating step comprises displaying a first indicia on said control unit for a detected clipping threshold at a tone signal level above said predetermined range; and
   displaying a second indicia on said control unit for a detected clipping threshold at a tone signal level below said predetermined range.

6. The method as defined in claim 5 wherein said first display indicia is an open circuit indicia.

7. The method as defined in claim 5 wherein said second display indicia is a short circuit indicia.

8. The method as defined in claim 5 and further comprising displaying a third indicia on said control unit for a detected clipping threshold at a tone signal level within said predetermined range.

9. The method as defined in claim 1 wherein said generating step comprises generating a signal at a frequency generally inaudible to the human ear.

10. The method as defined in claim 9 wherein said generating step generates a 19 KHz signal.

11. The method as defined in claim 1 wherein said communication system comprises a plurality of speakers and said method comprises sequentially repeating said recited steps for each speaker.

12. A diagnostic circuit for a DSP communication system having a control unit, a DSP unit, a power amplifier and a speaker, the system comprising:
a diagnostic initiator comprising a predetermined input on the control unit;
a DSP programmed processor for generating a test signal and controlling the magnitude of the signal, and a DA converter for applying said test signal to the power amplifier;
a detector for determining a threshold of amplifier output clipping;
a monitor for determining the level of test signal detected at which said clipping threshold of amplifier output occurs; and
indicia for indicating whether the amplifier is properly coupled to a speaker by comparing the detected level of the test signal at said clipping threshold with a predetermined range of levels.

13. The diagnostic circuit as defined in claim 12 wherein said initiator comprises a key press.

14. The diagnostic circuit as defined in claim 13 wherein said key press is a simultaneous multi-switch actuator.

15. The diagnostic circuit as defined in claim 11 wherein said system comprises a plurality of audio channels and switch means for serially testing each of said audio channels by the recited steps.

16. A DSP radio with diagnostic analysis of the amplifier-to-speaker connection, comprising:
a controller unit having a plurality of control actuators;
a DSP processor unit including programmed means for generating a tone signal in response to a selected actuation of at least a portion of said actuators;
an applicator for delivering said tone signal to said amplifier at a level outside of a predetermined range of operating values, and means for varying the level of said tone signal throughout the predetermined range of operating values;
a detector for determining a threshold of clipping at amplifier output;
a monitor for determining the magnitude level of the tone signal at the threshold of clipping at amplifier output; and
a comparor for comparing the magnitude level of the tone signal at the threshold of clipping at amplifier output with a predetermined range of tone signal levels having an upper limit at which the amplifier-to-speaker connection is open circuited, a lower limit at which the amplifier-to-speaker connection is short circuited, and a normal range between said upper and lower limits.

* * * * *